United States Patent
Buhler et al.

(10) Patent No.: US 6,924,584 B2
(45) Date of Patent: Aug. 2, 2005

(54) PIEZOELECTRIC TRANSDUCERS UTILIZING SUB-DIAPHRAGMS

(75) Inventors: Steven A. Buhler, Sunnyvale, CA (US); John S. Fitch, Los Altos, CA (US); Meng H. Lean, Santa Clara, CA (US); Karl A. Littau, Palo Alto, CA (US)

(73) Assignee: Palo Alto Research Center Inc., Palo Alto, CA (US)

( * ) Notice: Subject to any disclaimer, the term of this patent is extended or adjusted under 35 U.S.C. 154(b) by 0 days.

(21) Appl. No.: 10/319,138

(22) Filed: Dec. 13, 2002

(65) Prior Publication Data

US 2004/0113521 A1 Jun. 17, 2004

(51) Int. Cl.⁷ .............................................. H01L 41/04
(52) U.S. Cl. ....................................................... 310/324
(58) Field of Search ................................ 310/324, 328; 347/68–72

(56) References Cited

U.S. PATENT DOCUMENTS

| | | | |
|---|---|---|---|
| 4,045,695 A | | 8/1977 | Itagaki et al. ............... 310/322 |
| 4,115,789 A | * | 9/1978 | Fischbeck ..................... 347/70 |
| 4,170,742 A | | 10/1979 | Itagaki et al. ............... 310/324 |
| 4,605,939 A | | 8/1986 | Hubbard et al. ............. 346/140 |
| 5,663,505 A | | 9/1997 | Nakamura .................... 73/702 |
| 5,862,275 A | * | 1/1999 | Takeuchi et al. .............. 385/19 |
| 6,323,580 B1 | * | 11/2001 | Bernstein .................... 310/324 |
| 6,402,303 B1 | * | 6/2002 | Sumi ........................... 347/68 |
| 6,767,084 B2 | * | 7/2004 | Moriya et al. ................ 347/70 |
| 6,802,597 B2 | * | 10/2004 | Furuhata ...................... 347/71 |
| 2001/0010529 A1 | * | 8/2001 | Furuhata et al. .............. 347/71 |

* cited by examiner

Primary Examiner—Thomas M. Dougherty
(74) Attorney, Agent, or Firm—Nola Mae McBain

(57) ABSTRACT

A system and method of operation is described which utilizes an array of piezoelectric actuators distributed over the surface of a diaphragm. In one embodiment, the piezoelectric actuator array is used to cause a net motion of the diaphragm equal to the sum of the motions of each individual sub-chamber diaphragm. The system can be used as a sensor where a common motion applied to the sub-chamber diaphragm causes a net charge equal to the sum of the charges on each piezoelectric diaphragm.

34 Claims, 11 Drawing Sheets

US 6,924,584 B2

PIEZOELECTRIC TRANSDUCERS UTILIZING SUB-DIAPHRAGMS

BACKGROUND

This invention relates generally to piezoelectric transducers, and more specifically provides an improved piezoelectric diaphragm which can be used as a sensor, or in fluid ejection applications.

Piezoelectric transducers have many applications. In particular, piezoelectric diaphragms have been employed as pressure sensors, in speakers for audio equipment, fluid ejection, fluid pumping and printing applications. The basic principles for the operation of piezoelectric transducers are as follows. A piezoelectric material having electrodes is bonded or deposited on one or both sides of a diaphragm material to form a piezoelectric actuated diaphragm. Diaphragms with piezoelectric material on one side only are referred to as uni-morph diaphragms, while diaphragms with piezoelectric material on both sides are referred to as bi-morph diaphragms. The piezoelectric actuated diaphragm can then be utilized in two modes.

The first mode is to apply a charge to the electrodes which creates a field across the piezoelectric material. The field will cause a strain in the piezoelectric material and the piezoelectric material and the diaphragm then moves. This first mode is very useful in applications such as fluid ejection applications or in audio equipment. In both cases, the piezoelectric diaphragm can be caused to oscillate in a useful manner. In the former case, to provide a force which will cause fluid to eject from a chamber and in the second case to cause a speaker diaphragm to oscillate and to reproduce sound.

The second mode of operation is the converse of the first. The piezoelectric diaphragm is subjected to a force, pressure, or displacement that will cause the diaphragm to bend or move. The physical movement of the diaphragm then causes polarization to take place in the piezoelectric material and a charge to be present on the electrodes. The diaphragm can thus be used as a sensor.

In many of these applications it can be desirable to use a piezoelectric material of a certain thickness. For instance, it may be advantageous to use sol-gel deposition to form the piezoelectric material resulting in a piezoelectric layer of approximately 1 micron thickness. Also, to achieve adequate sensitivity, as in sensor applications, or volume displacement, as in fluid ejection or audio applications, the area of the diaphragm must be of at least a minimum size. However, because a larger diaphragm will generally be less stiff, there are trade-offs between sensitivity or efficiency and stiffness in designing piezoelectric diaphragms. Therefore, there is a need to provide a thin film piezoelectric diaphragm that can provide both adequate sensitivity or efficiency while at the same time maintaining a desired stiffness.

There is provided a piezoelectric diaphragm system which can maintain both adequate stiffness characteristics as well as maintaining adequate sensitivity or displacement characteristics. This is achieved by utilizing an array of smaller diaphragms built onto a single chamber. As each individual diaphragm can be kept relatively smaller, then the size of each diaphragm can be designed to maintain the desired stiffness characteristics. However, using an array of diaphragms acting in parallel then allows the total area to be covered to be larger than any one sub-diaphragm to achieve the desired sensitivity or efficiency characteristics for the total chamber.

Further advantages will become apparent as the following description proceeds.

SUMMARY

Briefly stated and in accordance with the present invention, there is provided a piezoelectric transducer having a chamber diaphragm having spaced sub-chamber diaphragms therein and piezoelectric material elements for actuating the spaced sub-chamber diaphragms. The chamber diaphragm has an upper surface and a lower surface. A sub-chamber diaphragm support structure having gaps therethrough is adjacent to the upper or lower surface of the of the chamber diaphragm. The piezoelectric material elements are placed adjacent to the upper surface of the chamber diaphragm and arranged so as to be within the gaps of the sub-chamber diaphragm support structure.

Figure 1:
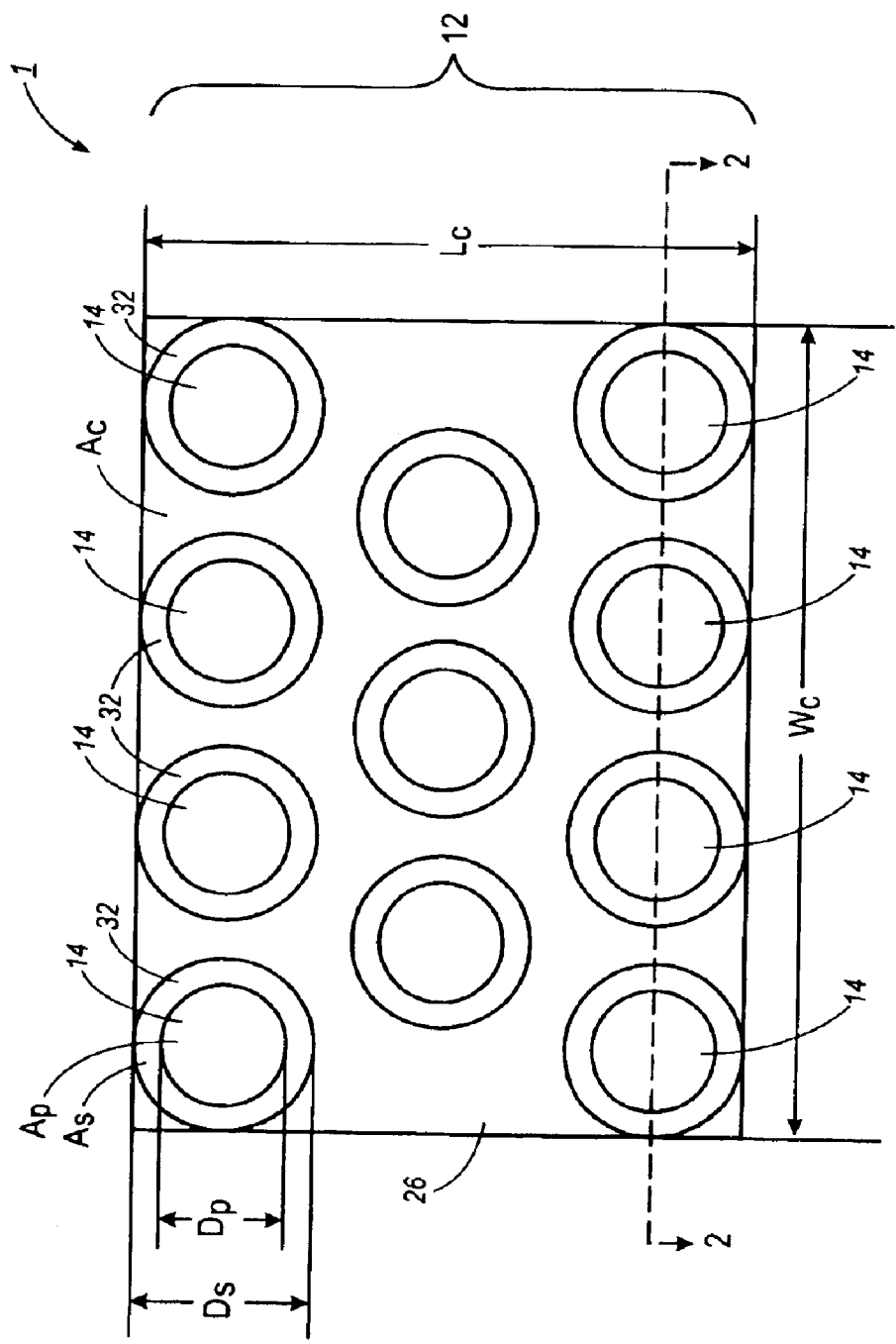
FIG. 1 is a top view of an embodiment of a piezoelectric transducer having multiple sub-chamber diaphragms according to the present invention.

While the present invention will be described in connection with a preferred embodiment and/or method of use, it will be understood that it is not intended to limit the invention to that embodiment and procedure. On the contrary, it is intended to cover all alternatives, modifications and equivalents as may be included within the spirit and scope of the invention as defined by the appended claims.

Alpha-Numeric List of the Elements

Ac chamber diaphragm area
Ap piezoelectric material element area
As sub-chamber diaphragm area
Dp piezoelectric material element diameter
Ds sub-chamber diaphragm diameter L zero bias line
Lc chamber diaphragm length
q− negative charge
q+ positive charge
V polarization vector
Wc chamber diaphragm width
1 piezoelectric transducer
10 chamber diaphragm
12 piezoelectric actuator group
14 piezoelectric material element
16 chamber
18 insulative layer
20 sub-chamber diaphragm
22 electrical contact layer
24 electrical contact
26 sub-chamber diaphragm support structure
28 chamber diaphragm lower surface
30 chamber diaphragm upper surface
32 sub-chamber diaphragm support structure gap
34 sub-chamber diaphragm support structure wall
36 ground connection
38 piezoelectric material element upper surface
40 piezoelectric actuator group
42 piezoelectric material element
44 sub-chamber diaphragm support structure
46 insulative layer
48 electrical contact layer
50 electrical contact

DETAILED DESCRIPTION

Figure 2:
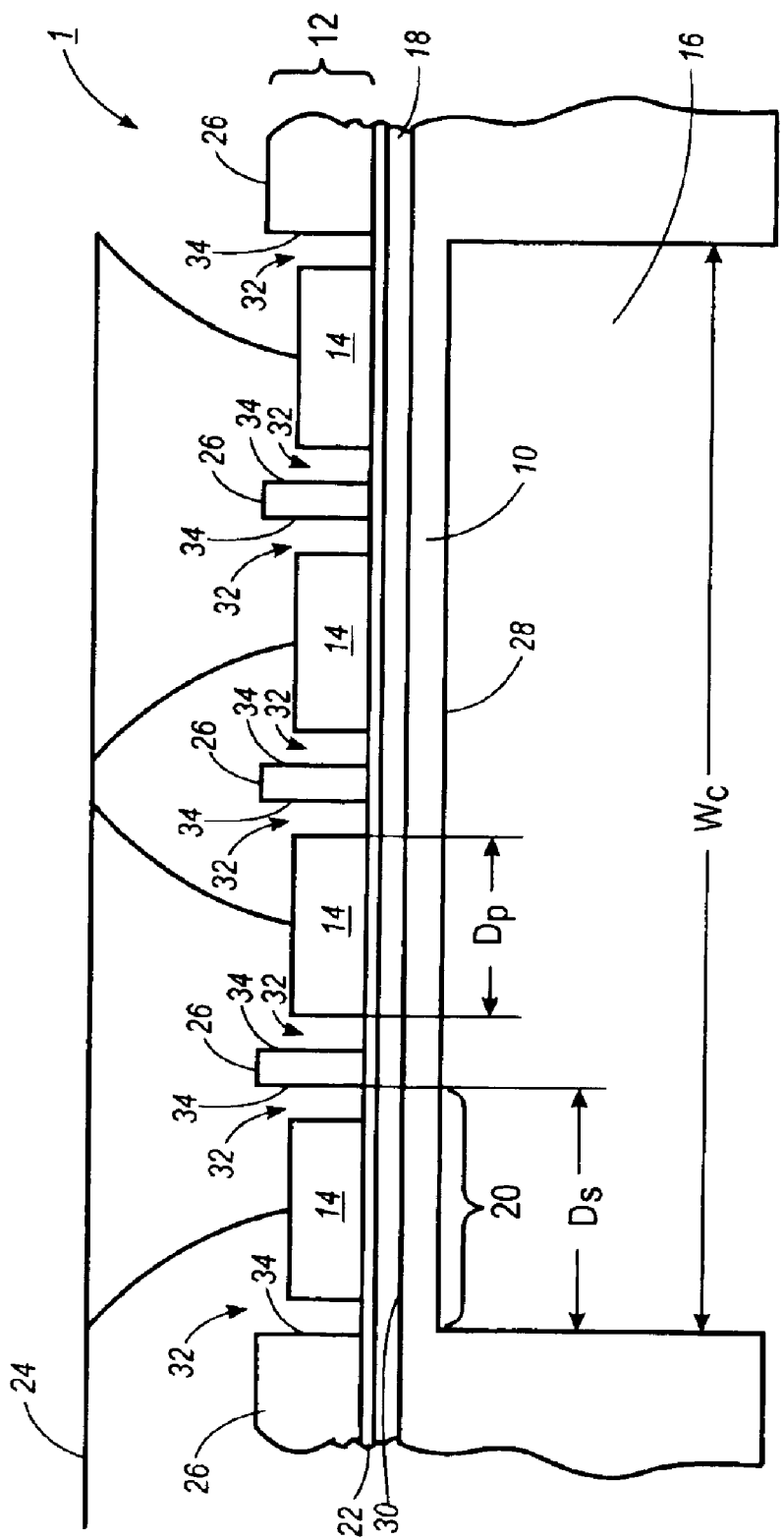
FIG. 2 is a cross-sectional view of an embodiment of the piezoelectric transducer shown in FIG. 1.

Turning now to FIGS. 1 and 2, a piezoelectric transducer 1 having a chamber diaphragm 10 over a chamber 16 having a piezoelectric actuator group 12 with eleven piezoelectric material elements 14, each in a sub-chamber diaphragm support structure gap 32 of a sub-chamber diaphragm support structure 26 is shown. FIG. 1 shows an overhead view while FIG. 2 shows a cross-sectional view taken through cross-section line 2—2 in FIG. 1. It should be noted that the shape of the chamber diaphragm 10, the piezoelectric material element 14, the sub-chamber diaphragm support structure gap as well as the arrangement of the eleven piezoelectric material elements 14 in the piezoelectric actuator group 12 are for exemplary purposes only and many variants are possible, some of which will be described below.

Figure 3:
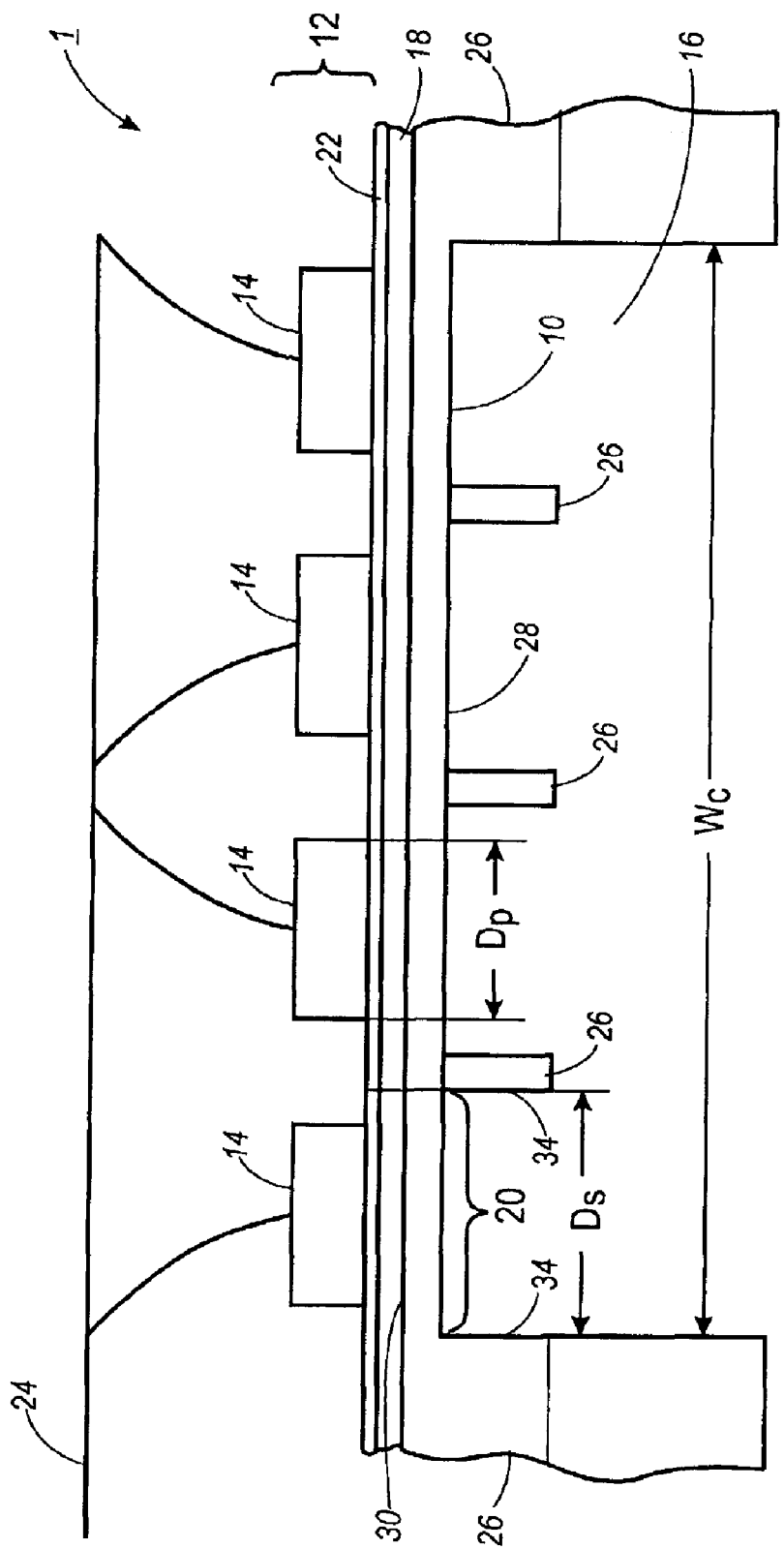
FIG. 3 is a cross-sectional view of an alternate embodiment of a piezoelectric transducer utilizing multiple sub-chamber diaphragms according to the present invention.

The chamber diaphragm 10 is approximately rectangular shaped in FIGS. 1, 2, and 3 and is at least partially covered by the piezoelectric material elements 14 in piezoelectric diaphragm group 12. Each piezoelectric material element 14 in the piezoelectric actuator group 12 is circular in FIGS. 1, 2, and 3 and the piezoelectric diaphragms in the piezoelectric actuator group 12 are arranged in a hexagonal close packed array. Each piezoelectric material element 14 is placed within a sub-chamber diaphragm support structure gap 32 in a sub-chamber diaphragm support structure 26 and aligned with a sub-chamber diaphragm 20. The chamber diaphragm 10 might be one of many chamber diaphragms 10 use to actuate the flow of ink in a piezoelectric printer as known in the art, or a diaphragm valve in a pressure sensor, as also known in the art. The chamber diaphragm 10 has a chamber diaphragm width Wc, a chamber diaphragm length Lc, and a chamber diaphragm area Ca. The piezoelectric material element 14 has a piezoelectric material element area Ap and a piezoelectric material element diameter Dp. The sub-chamber diaphragm support structure gap 32 defines a sub-chamber diaphragm 20 that is a portion of the chamber diaphragm 10 and has a sub-chamber diaphragm diameter Ds. As can be seen in FIG. 2, the sub-chamber diaphragm support structure walls 34 define the perimeter of each sub-chamber diaphragm 20. The sub-chamber diaphragm support structure 26 is used to provide additional stiffness to the chamber diaphragm 10 at the perimeter of and between the sub-chamber diaphragms 20. There may be other alternatives which can provide the stiffness to the sub-chamber diaphragm 10 at the perimeter of and between the sub-chamber diaphragms 20, which do not require the sub-chamber diaphragm support structure 26. It should be noted that in FIG. 2, the piezoelectric actuator group 12 and the sub-chamber diaphragm support structure 26 are shown as being adjacent to the chamber diaphragm upper surface 30. However, this need not be the case, the piezoelectric actuator group 12 and the sub-chamber diaphragm support structure 26 could equally well be placed adjacent to the chamber diaphragm lower surface 28.

The stiffness of a single given sub-chamber diaphragm 20, is defined as the ratio of pressure to volume change as the area As moves in the direction perpendicular to the plane of the diaphragm. The stiffness has been found to decrease by approximately the sixth power of the sub-chamber diaphragm diameter, Ds, when the thickness of the piezoelectric material element 14 and the sub-chamber diaphragm 20, are kept constant. That is, smaller sub-chamber diaphragms 20, of a given thickness will be stiffer than larger sub-chamber-diaphragms of the same thickness. Stiffness has been found to increase by approximately the power of 2.5 of the thickness of the chamber diaphragm 10 or sub-chamber diaphragm area As when the piezoelectric material element 14 is scaled proportionally. That is, thicker chamber diaphragms 10 or sub-chamber diaphragms 20 will be stiffer than thinner chamber diaphragms 10 or sub-chamber diaphragms 20 of the same chamber diaphragm area Ac or sub-chamber diaphragm area As. These relationships can be used to design a piezoelectric actuator group 12 such that desired stiffness characteristics can be maintained for the chamber diaphragm area Ac while at the same time reducing the thickness of piezoelectric material needed for each individual sub-chamber diaphragm 20. Additionally, the sensitivity of the piezoelectric transducer 1, defined as the change in chamber volume per volt applied, may be maintained or somewhat improved as well as achieving more consistent device performance.

For instance, if the entire chamber diaphragm area Ac were covered with piezoelectric material to form a single piezoelectric actuated diaphragm, the piezoelectric material layer might need to be relatively thick to maintain desired stiffness characteristics for a given application, such as fluid pumping. However, by utilizing a piezoelectric actuator group 12 wherein each individual sub-chamber diaphragm 20, covers only a portion of the chamber diaphragm area Ca, the desired stiffness characteristic can be maintained over the chamber diaphragm 10, while using a thickness that is substantially smaller. This is due to the relationship between the stiffness of each sub-chamber diaphragm 20 to the stiffness of the chamber diaphragm 10. The stiffness of the chamber diaphragm 10 equals the stiffness of the sub-chamber diaphragm 20 multiplied by some number 1/n, where n equals the number of sub-chamber diaphragms 20 on the chamber diaphragm 10. In the embodiment shown in FIGS. 1 and 2 there are eleven sub-chamber diaphragms 20, therefore the stiffness of each sub-chamber diaphragm 20 will need to be eleven times greater than the desired stiffness of the chamber diaphragm 10. However, as discussed earlier, stiffness increases by a power law as a diaphragm is made smaller, so it is quite feasible to design multiple smaller diaphragms with desirable stiffness characteristics and which are constructed with a thinner piezoelectric material element 14.

The chamber diaphragm 10 may be made out of any material with adequate stiffness and strength and manufacturability. The material stiffness, as measured by well-know parameters such as mechanical elastic modulus and poisson ratio, would be chosen for a given application to best achieve design goals such as stiffness of the chamber 16, which is measured by pressure change per volume change of the chamber as described above. For instance, silicon, polysilicon, silicon nitride, stainless steel or silicon dioxide are commonly used although other materials such as plastics, metals such as aluminum and nickel or others, glass, or epoxy resins may also be used. The chamber diaphragm 10 has two surfaces, a chamber diaphragm lower surface 28 which faces the chamber 16 and a chamber diaphragm upper surface 30 which is opposed to the chamber diaphragm lower surface 28 and faces the sub-chamber diaphragm support structure 26 and piezoelectric material elements 14.

The piezoelectric material elements 14 may be made out of any material which is ferroelectric in nature or electrostrictive or any material which changes physical dimension as the electric field in the material is changed. For instance, various ceramic materials may be used such as lead-zirconate-titanate (PZT), lead-titanate (PbTiO3), barium-titanate (BaTiO3), lead-magnesium-niobium-titanate (PMNPT) or crystalline materials such as zinc-oxide (ZnO), aluminum-nitride (AlN), quartz, lithium-tantalate (LiTaO3) and lithium-niobate (LiNbO2). Any of these materials may be used in forms that are polycrystalline or single crystal in nature. Also polymeric materials such as polyvinylidene fluoride (PVDF) and its co-polymers or other polymers may be used. However, it should be noted that the individual piezoelectric elements 14 in the piezoelectric actuator group 12 need not be made of the same material.

Interposed between the piezoelectric actuator group 12 and the chamber diaphragm upper surface 30, or the chamber diaphragm lower surface 28 if the piezoelectric material elements 14 are alternatively place adjacent to the chamber diaphragm lower surface 28, of the chamber diaphragm 10 is an electrical contact layer 22 for making electrical contact with each piezoelectric material element 14 in the piezoelectric diaphragm group 12. The electrical contact layer 22 can be made out of a wide variety of conductive materials as is known in the art. For instance, nickel, aluminum, copper, titanium alloys, or indium tin oxide may be used although other materials having sufficient conductivity may also be used.

Electrical contacts 24 are also shown for making electrical contact with each piezoelectric material element 14 in the piezoelectric diaphragm group 12. The electrical contacts 24 can also be made out of a wide variety of conductive materials as is known in the art. For instance aluminum, copper, gold, and nickel may be used although other materials having sufficient conductivity may also be used.

FIG. 2 also shows an insulative layer 18 interposed between the electrical contact layer 22 and the chamber diaphragm 10, although this layer may not be necessary and may be left out of some implementations. In particular, some implementations may utilize a conductive chamber diaphragm 10 as the electrical contact layer in which case both the insulative layer 18 and the additional electrical contact layer 22 may be omitted. The insulative layer 18 is used to insulate the chamber diaphragm 10 from any electrical signals carried on the electrical contact layer 22. The insulative layer 18 is commonly made out of dielectric materials having sufficient resistivity such that leakage currents are kept to an acceptably small value, suitable mechanical properties such that the film remains intact over time and manufacturability. Resistivities greater than $10^{10}$ are commonly used. Some examples of suitable dielectric materials include silicon dioxide, silicon nitride, silicon oxynitride, epoxy resins, polyimides and mylar layers although other materials may be used if they have suitable properties.

Interposed laterally between each of the piezoelectric material elements 14 in the piezoelectric actuator group 12 and adjacent to the chamber diaphragm upper surface 30, or the chamber diaphragm lower surface 28 if the piezoelectric actuator group 12 is placed adjacent to the chamber diaphragm lower surface 28, of the chamber diaphragm 10 are the sub-chamber diaphragm support structure walls 34 of the sub-chamber diaphragm support structure 26. The sub-chamber diaphragm support structure 26 is a rigid material which effectively pins the portion of the electrical contact layer 22, insulative layer 18, and chamber diaphragm 10 adjacent to each of the sub-chamber diaphragm support structure walls 34 allowing each piezoelectric material element 14 to act properly upon the sub-chamber diaphragms 20 when they are actuated. The sub-chamber diaphragm support structure 26 can be made out of a variety of materials which have adequate stiffness as described elsewhere in this document and manufacturability. Some examples include stainless steel, nickel, silicon, polysilicon, silicon dioxide, and glass, although other materials may be used.

FIG. 3 shows a cross-sectional view of an alternate embodiment of a chamber 16 utilizing the piezoelectric actuator group 12 to actuate the chamber diaphragm 10. As the elements shown in FIG. 3 are similar to the elements shown in FIG. 2 consistent numbering will be used and like reference numbers will identify like elements. The chamber 16 could be one of many chambers in a piezoelectric printer, as known in the art, or in a pressure sensor, as also known in the art.

The chamber diaphragm 10 may be made out of any material with adequate stiffness such that the deflection and force of the diaphragm motion meet design goals and reliable strength and manufacturability as described above with respect to FIG. 2. The chamber diaphragm 10 has two surfaces, a chamber diaphragm lower surface 28 which faces the chamber 16 and an chamber diaphragm upper surface 30 which is opposed to the chamber diaphragm lower surface 28.

Interposed between the piezoelectric actuator group 12 and the chamber diaphragm upper surface 30 of the chamber diaphragm 10 is an electrical contact layer 22 for making electrical contact with each piezoelectric material element 14 in the piezoelectric diaphragm group 12. The electrical contact layer 22 can be made out of a wide variety of conductive materials as described with respect to FIG. 2. The electrical contact layer 22 may be used as either a ground plane to provide a ground connection to each piezoelectric material element 14 in the piezoelectric actuator group 12 or as an activating signal plane to provide a signal connection to each piezoelectric material element 14 in the piezoelectric diaphragm group 12.

Electrical contacts 24 are also shown for making electrical contact with each piezoelectric material element 14 in the piezoelectric diaphragm group 12. The electrical contacts 24 can also be made out of a wide variety of conductive materials as is known in the art and described above with respect to FIG. 2.

FIG. 3 shows an insulative layer 18 interposed between the electrical contact layer 22 and the chamber diaphragm 10, although this layer may not be necessary and may be left out of some implementations. In particular, some implementations may utilize a conductive chamber diaphragm 10 as the electrical contact layer in which case both the insulative layer 18 and the additional electrical contact layer 22 may be omitted. The insulative layer 18 is used to insulate the chamber diaphragm 10 from any electrical signals carried on the electrical contact layer 22. The insulative layer 18 is commonly made out of a variety of dielectric materials as described above with respect to FIG. 2.

In FIG. 2, the sub-chamber diaphragm support structure 26 was placed adjacent to the chamber diaphragm upper surface 30 and each piezoelectric material element 14 was placed within a sub-chamber support structure gap 32 between diaphragm support structure walls 34 and aligned to the sub-chamber diaphragm 20 defined by the sub-chamber support structure gap 32. FIG. 3 differs from FIG. 2 in that the sub-chamber diaphragm support structure 26 was placed adjacent to the chamber diaphragm lower surface 28. However, each piezoelectric material element is still aligned to the sub-chamber diaphragm 20 defined by the sub-chamber support structure gap 32. The sub-chamber diaphragm support structure 26 is a rigid material which effectively pins the portion of the chamber diaphragm 10 adjacent to each of the sub-chamber diaphragm support structure walls 34 allowing each piezoelectric material element 14 to act properly upon the sub-chamber diaphragms 20 when voltage is applied between the contacts 24 and 22. The sub-chamber diaphragm support structure 26 can be made out of a variety of materials as discussed above with respect to FIG. 2. The piezoelectric material elements 14 are aligned with the sub-chamber diaphragm support structure gaps 32 which define the sub-chamber diaphragms 20.

It should also be noted that while this figure shows the sub-chamber diaphragm support structure 26, placed adjacent to the chamber diaphragm lower surface 28 and the piezoelectric actuator group 14 placed adjacent to the chamber diaphragm upper surface 30, that the sub-chamber diaphragm support structure 26 could equally well be placed adjacent to the chamber diaphragm upper surface 30 and the piezoelectric actuator group 14 could be placed adjacent to the chamber diaphragm lower surface 28. As described above, each piezoelectric material element 14 is still aligned to the sub-chamber diaphragm 20 defined by the sub-chamber support structure gap 32. In such a case, the electrical contact layer 22, if used, will be interposed between the piezoelectric actuator group 12 and the chamber diaphragm lower surface 28 of the chamber diaphragm 10. Likewise, the insulative layer 18, if used, will be interposed between the electrical contact layer 22 and the chamber diaphragm lower surface 28 of the chamber diaphragm 10.

Figure 4:
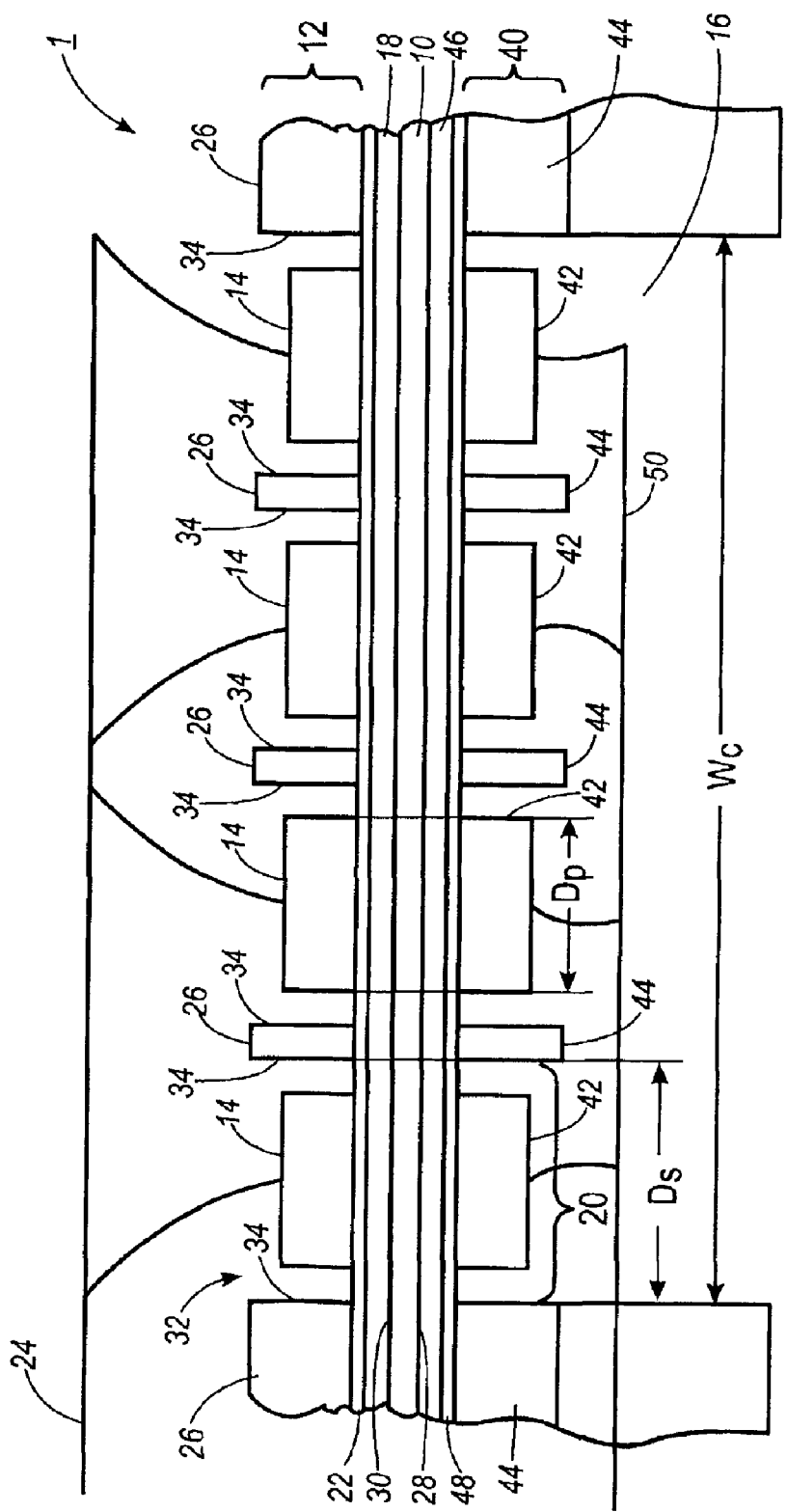
FIG. 4 is a cross-sectional view of an alternative embodiment of a piezoelectric transducer utilizing multiple sub-chamber diaphragms according to the present invention.

FIG. 4 shows a cross-sectional view of an alternate embodiment of the invention utilizing a bimorph structure. As many of the elements are the same as those shown in FIGS. 1–3, the same reference numbers will be used to denote the same elements. FIG. 4 shows chamber 16 utilizing two piezoelectric actuator groups 12, 40 to actuate the chamber diaphragm 10. The chamber 16 could be one of many chambers in a piezoelectric printer, as known in the art, or in a pressure sensor, as also known in the art.

The chamber diaphragm 10 may be made out of any material with adequate stiffness such that the deflection and force of the diaphragm motion meet design goals and reliable strength and manufacturability as described above with respect to FIGS. 1–3. The chamber diaphragm 10 has two surfaces, a chamber diaphragm lower surface 28 which faces the chamber 16 and an chamber diaphragm upper surface 30 which is opposed to the chamber diaphragm lower surface 28. One of the piezoelectric actuator groups 12 is located adjacent to the chamber diaphragm upper surface 30, while the other piezoelectric actuator group 40 is adjacent to the chamber diaphragm lower surface 28.

The piezoelectric material elements 14, 42 may be made out of any material which is ferroelectric in nature or electrostrictive or any material which changes physical dimension as the electric field in the material is changed. For instance, various ceramic materials may be used such as lead-zirconate-titanate (PZT), lead-titanate (PbTiO2), barium-titanate (BaTiO3), lead-magnesium-niobium-titanate (PMNPT) or crystalline materials such as zinc-oxide (ZnO), aluminum-nitride (AlN), quartz, lithium-tantalate (LiTaO3) and lithium-niobate (LiNbO2). Any of these materials may be used in forms that are polycrystalline or single crystal in nature. Also polymeric materials such as polyvinylidene fluoride (PVDF) and its co-polymers or other polymers may be used. However, it should be noted that the individual piezoelectric material elements 14, 42 need not be made from the same material.

Interposed between each of the piezoelectric actuator groups 12, 40 and the respective chamber diaphragm surfaces 30, 28 of the chamber diaphragm 10 are electrical contact layers 22, 48 for making electrical contact with each piezoelectric material element 14, 42 in each of the piezoelectric diaphragm groups 12, 40. The electrical contact layers 22, 48 can be made out of a wide variety of conductive materials as described with respect to FIGS. 2 and 3. However, it should be noted that the electrical contact layers 22, 48 need not be made from the same material. The electrical contact layers 22, 48 may be used as either a ground plane to provide a ground connection to each piezoelectric material element 14, 42 in each of the piezoelectric actuator groups 12, 40 or as an activating signal plane to provide a signal connection to each piezoelectric material element 14, 42 in each of the piezoelectric diaphragm group 12, 40.

Electrical contacts 24, 50 are also shown for making electrical contact with each piezoelectric material element 14, 42 in each of the piezoelectric diaphragm groups 12, 40, respectively. The electrical contacts 24, 50 can also be made out of a wide variety of conductive materials as is known in the art and described above with respect to FIGS. 2 and 3. However, it should be noted that the electrical contacts 24, 50 need not be made out of the same material.

FIG. 4 shows two insulative layers 18, 46 wherein one insulative layer 18 is interposed between one of the electrical contact layers 22 and the chamber diaphragm 10 and the other insulative layer 46 is interposed between the other electrical contact layer 48 and the chamber diaphragm 10. It should be noted that these insulative layers 18, 46 may not be necessary and may be left out of some implementations. In particular, some implementations may utilize a conductive chamber diaphragm 10 as the electrical contact layer in which case both the insulative layers 18, 46 and the additional electrical contact layers 22, 48 may be omitted. The insulative layers 18, 46 are used to insulate the chamber diaphragm 10 from any electrical signals carried on the electrical contact layers 22, 48. The insulative layers 18, 46 are commonly made out of a variety of dielectric materials as described above with respect to FIGS. 2 and 3. However, it should be noted that the insulative layers 18, 49 need not be made from the same material.

In FIGS. 2 and 3, a single sub-chamber diaphragm support structure 26 was placed adjacent to a chamber diaphragm surface and a single piezoelectric actuator group 12 was used with each piezoelectric material element 14 aligned to the sub-chamber diaphragm 20 defined by the sub-chamber support structure gap 32. FIG. 4 differs from FIGS. 2 and 3 in that two sub-chamber diaphragm support structures 26, 44 are utilized along with two piezoelectric actuators groups 12, 40. Each of sub-chamber diaphragm support structures are aligned to each other such that the sub-chamber diaphragms 20 are still defined by the sub-chamber support structure gap 32. Each of the piezoelectric material elements 14, 42 is aligned with a sub-chamber diaphragm 20 and each sub-chamber diaphragm 20 has two piezoelectric material elements 14, 42 aligned with it, one on the chamber diaphragm upper surface 30 and one on the chamber diaphragm lower surface 28. It should be noted that while this embodiment shows two sub-chamber diaphragm support structures 26, 44 that some embodiments may utilize only one sub-chamber diaphragm support structure. The single sub-chamber diaphragm support structure may be placed adjacent to either the chamber diaphragm upper surface 30 or the chamber diaphragm lower surface 28. The sub-chamber diaphragms 20 will be defined by sub-chamber support structure gap 32 and each sub-chamber diaphragm 20 will continue to have two piezoelectric material elements 14, 42 aligned with it, one on the chamber diaphragm upper surface 30 and one on the chamber diaphragm lower surface 28.

The sub-chamber diaphragm support structures 26, 44 are rigid materials which effectively pin the portion of the chamber diaphragm 10 adjacent to each of the sub-chamber diaphragm support structure walls 34 allowing each piezoelectric material element 14, 42 to act properly upon the sub-chamber diaphragms 20 when voltage is applied between the contacts 24 and 22 for the piezoelectric material elements 14 and between the contacts 48 and 50 for the piezoelectric material elements 42. The sub-chamber diaphragm support structures 26, 44 can be made out of a variety of materials as discussed above with respect to FIGS. 2 and 3. However, it should be noted that the sub-chamber diaphragm support structure 26, 44 need not be made out of the same material.

Figure 5:
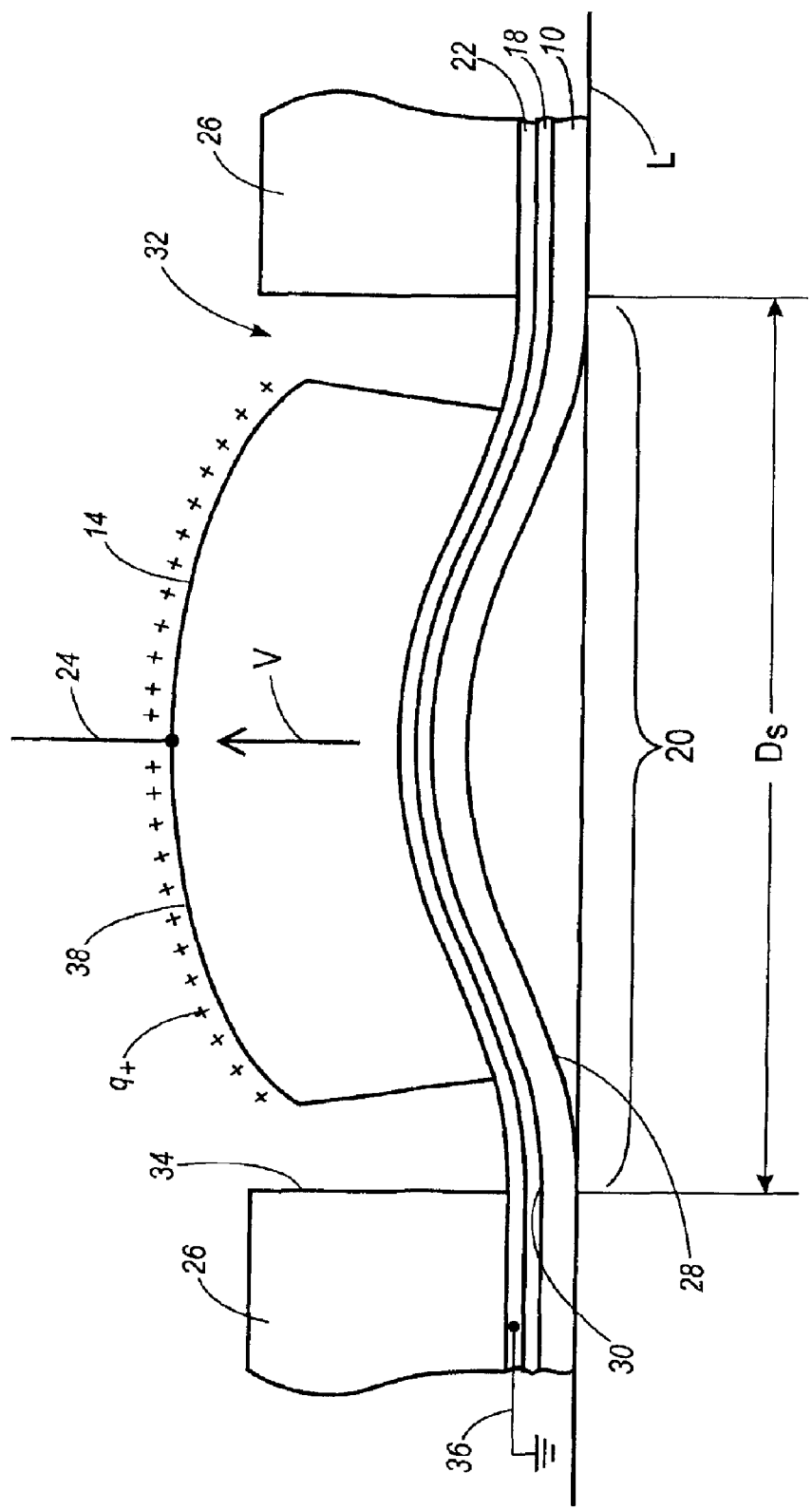
FIG. 5 shows a cross-sectional view of single sub-chamber diaphragm and associated piezoelectric material element under certain operating conditions.
Figure 6:
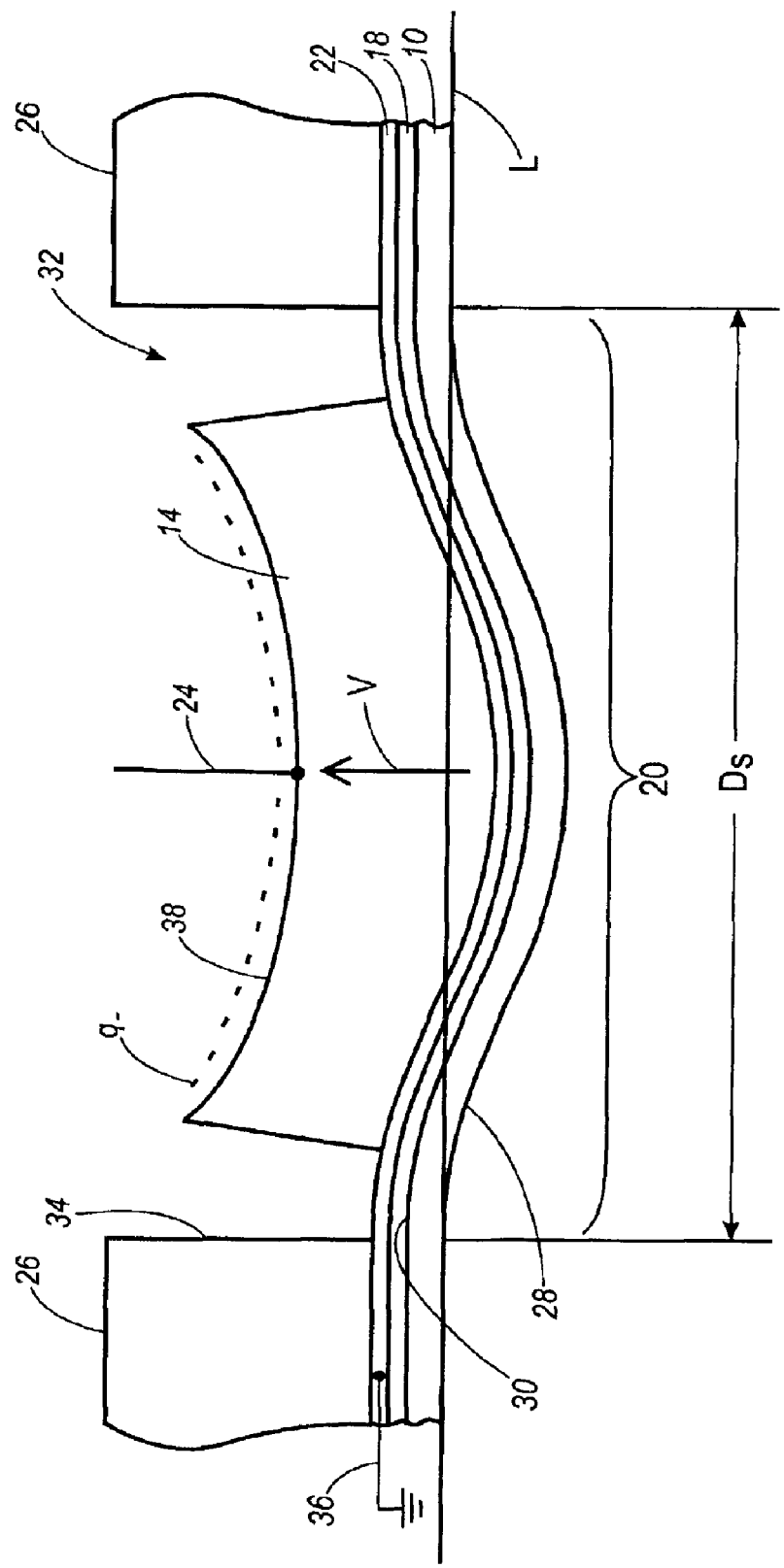
FIG. 6 shows a cross-sectional view of single sub-chamber diaphragm and associated piezoelectric material element under certain operating conditions.

FIGS. 5 and 6 show a single piezoelectric actuator and its associated sub-chamber diaphragm 20 and sub-chamber diaphragm support structure 26 during an operational state. It should be noted that while these figures show the operation of the structure shown in FIG. 2, the operation of structures shown in alternative embodiments follows similar principles, as is known in the art. For the ease of description, some assumptions have been made about the operating conditions. For instance, a polarization vector V is shown in the piezoelectric material element 14 and certain voltage and charge conditions are shown. It should be noted that the system can also be operated if the polarization vector V is reversed although the voltage conditions will need to be reversed as well. Also, electrical contact layer 22 is shown connected to ground connection 36. It should be noted that electrical contact layer need not be connected to ground, ground is merely used for ease of description of the voltage difference between electrical contact layer 22 and electrical contact 24. In other words, any arbitrary DC offset voltage may be used so long as the relative voltage differences between electrical contact layer 22 and electrical contact 24 are maintained.

FIG. 5 shows the condition where a positive voltage is applied to electrical contact 24. This results in a net positive charge q+ on the piezoelectric actuator upper surface 38 and an electric field across the piezoelectric material element 14. The piezoelectric material element 14 and sub-chamber diaphragm 20 will respond with a net upward motion of the piezoelectric material element upper surface 38 caused by the extension of the piezoelectric material element in the plane of the diaphragm and the subsequent bending of the structure. The interposed electrical contact layer 22 and insulative layer 18 will also flex in an upward direction. For comparison, line L shows the previous position of the lower surface of the sub-chamber diaphragm 28, when no voltages have been applied,. As long as the field strength within the piezoelectric material element 14 remains less than approximately ⅓ of the coercive field of the piezoelectric material the piezoelectric material element 14 will respond approximately linearly to the amount of positive voltage applied to the electrical contact 24. Higher voltages will result in a larger upward motion and smaller voltages will result in a smaller upward motion. If the field strength exceeds approximately ⅓ of the coercive field the piezoelectric material element 14 will begin to show a non-linear response and the polarization of the piezoelectric material may degrade over time. The specific voltages used will depend on the characteristics of the piezoelectric material used, its thickness, the chamber diaphragm 10, and the sub-chamber diaphragm support structure 26.

Conversely, if the device is to be used as a sensor, a positive pressure applied to the chamber diaphragm lower surface 28 will result in the upward flexing of the sub-chamber diaphragm 20 along with the insulative layer, the electrical contact layer 22, and the piezoelectric material element 14. The upward flexing of the piezoelectric material element 14 will cause a net negative charge on the piezoelectric material element upper surface 38. Again, the net negative charge can be determined using any conventional method, such as a voltmeter, and correlated with specific positive pressure.

FIG. 6 shows the condition where a negative voltage is applied to electrical contact 24. This results in a net negative charge q− on the piezoelectric material element upper surface 38 and an electric field across the piezoelectric material element 14. The piezoelectric material element 14 and sub-chamber diaphragm 20 will respond with a net downward motion of the piezoelectric material element upper surface 38 caused by the contraction of the piezoelectric material in the plane of the diaphragm and the subsequent bending of the unimorph structure The interposed electrical contact layer 22 and insulative layer 18 will also flex in an downward direction. For comparison, line L shows the previous position of the lower surface of the sub-chamber diaphragm 28, when no voltages have been applied. As long as the field strength within the piezoelectric material element 14 remains less than approximately ⅓ of the coercive field of the piezoelectric material the diaphragm will respond in a linearly way to the magnitude of the negative voltage applied to the electrical contact 24. More negative voltages will result in a larger downward motion and less negative voltages will result in a smaller downward motion. If the magnitude of the field strength exceeds approximately ⅓ of the coercive field magnitude the piezoelectric material element 14 will begin to show a non-linear response. The specific voltages used will depend on the characteristics of the piezoelectric material used, its thickness, the chamber diaphragm 10, and the sub-chamber diaphragm support structure 26.

Conversely, if the device is to be used as a sensor, a negative pressure applied to the chamber diaphragm lower surface 28 will result in the downward flexing of the sub-chamber diaphragm 20 along with the insulative layer, the electrical contact layer 22, and the piezoelectric material element 14. The downward flexing of the piezoelectric material element 14 will cause a net positive charge on the piezoelectric material element upper surface 38. Again, the net positive charge can be determined using any conventional method, such as a voltmeter, and correlated with a specific negative pressure.

Figure 7:
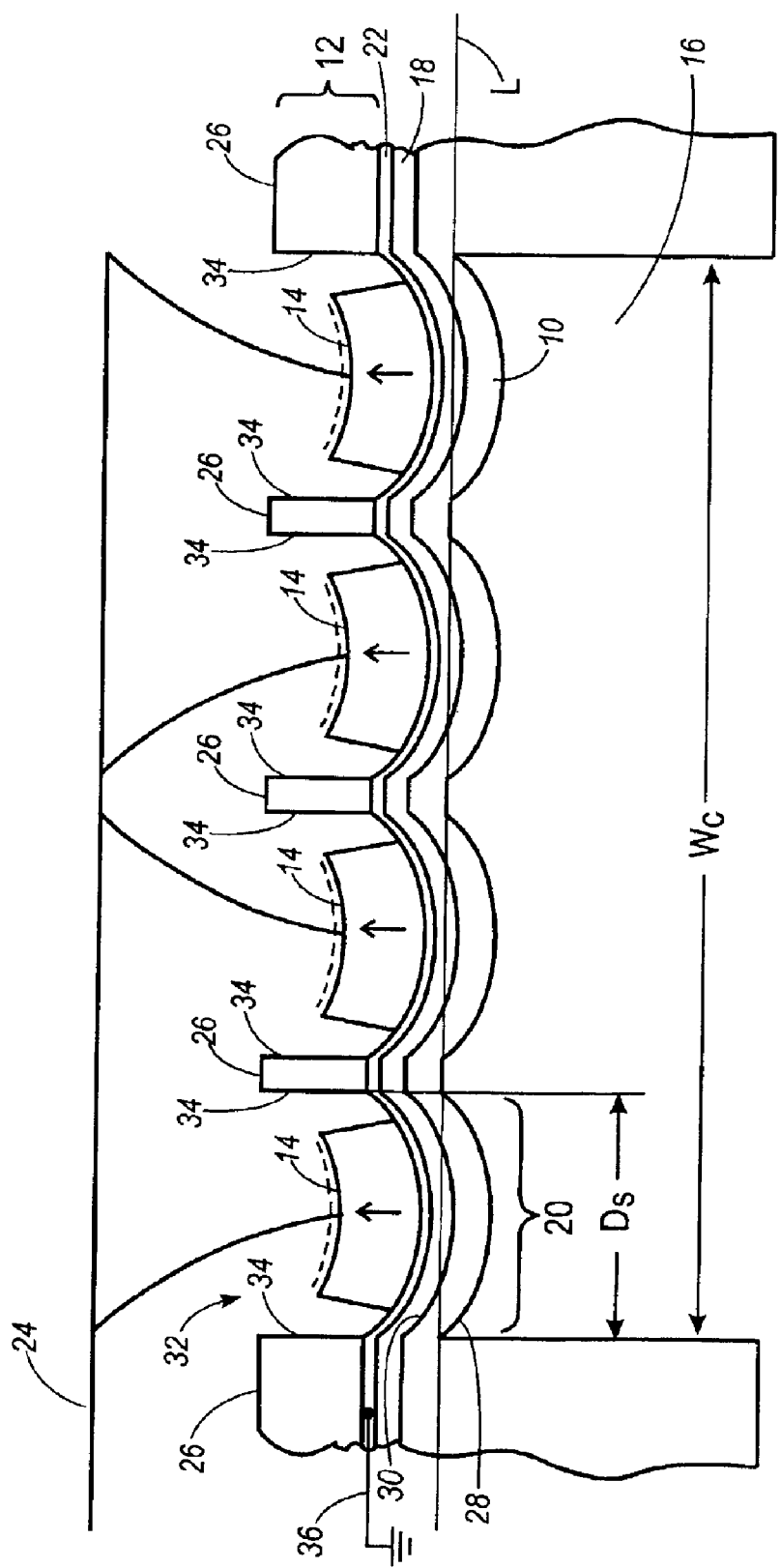
FIG. 7 shows the structure shown in FIG. 6 when arrayed in the manner shown in FIG. 2.

FIG. 7 shows the structure shown in FIG. 2 under the operating conditions shown in FIG. 6. Again it should be noted that the operation of structures shown in alternative embodiments follows similar principles, as is known in the art. Again, in this case a negative voltage is applied to electrical contact 24. This results in a net negative charge q− on each piezoelectric material element upper surface 38 and an electric field across each piezoelectric material element 14 in the piezoelectric actuator group 12. Each piezoelectric material element 14 will respond with a net downward motion of its upper surface 38 along with the sub-chamber diaphragm 20 and the interposed electrical contact layer 22 and insulative layer 18. For comparison, line L shows the previous position, when no voltages have been applied, of the chamber diaphragm lower surface 28. As can be seen in FIG. 7, the net motion of the chamber diaphragm 10 is the sum of the individual motions of the sub-chamber diaphragms 20. This allows for a net total motion of substantial portions of the chamber diaphragm 10 utilizing an array of smaller sub-chamber diaphragms in the piezoelectric actuator group 12. Similar results would apply if a positive voltage were applied, such as shown in FIG. 5, resulting in a net upward motion of the chamber diaphragm 10 which is the sum of the upward motions of all of the sub-chamber diaphragms 20.

Conversely, if the device is to be used as a sensor, a negative pressure applied to the chamber diaphragm lower surface 28 will result in the downward flexing of each sub-chamber diaphragm 20 of the chamber diaphragm 10 along with the insulative layer, the electrical contact layer 22, and each piezoelectric material element 14 in piezoelectric actuator group 12. The downward flexing of the piezoelectric material element 14 will cause a net positive charge on each piezoelectric material element upper surface 38 of each piezoelectric material element 14 in the piezoelectric actuator group 12. Again, because the response of each piezoelectric material element 14 is linear, the sum of the net positive charges on each piezoelectric material element 14 can be determined using any conventional method, such as a voltmeter, and correlated with a specific negative pressure. Again, the same would be if a positive pressure were applied, such as shown in FIG. 5, resulting in a net upward motion of the chamber diaphragm 10 and a net negative charge on all of the piezoelectric material elements 14 in the piezoelectric actuator group.

The discussion of piezoelectric transducers above has been focussed on the FIGS. 1–7 which shows round piezoelectric material elements 14 and sub-chamber diaphragms 20 arranged in a hexagonal packing structure on a rectangular chamber diaphragm 10. However, many different variations are possible and these will be discussed with reference to FIGS. 8–11. It should be noted that as FIGS. 8–11 show the same elements as the forgoing figures, the same reference numbers will be used to denote like elements. It should be further noted that while the discussion and drawings of FIGS. 8–11 are made with reference to the structure shown in FIG. 2, the variations are applicable to the other embodiments shown and discussed hereinabove as well.

Figure 8:
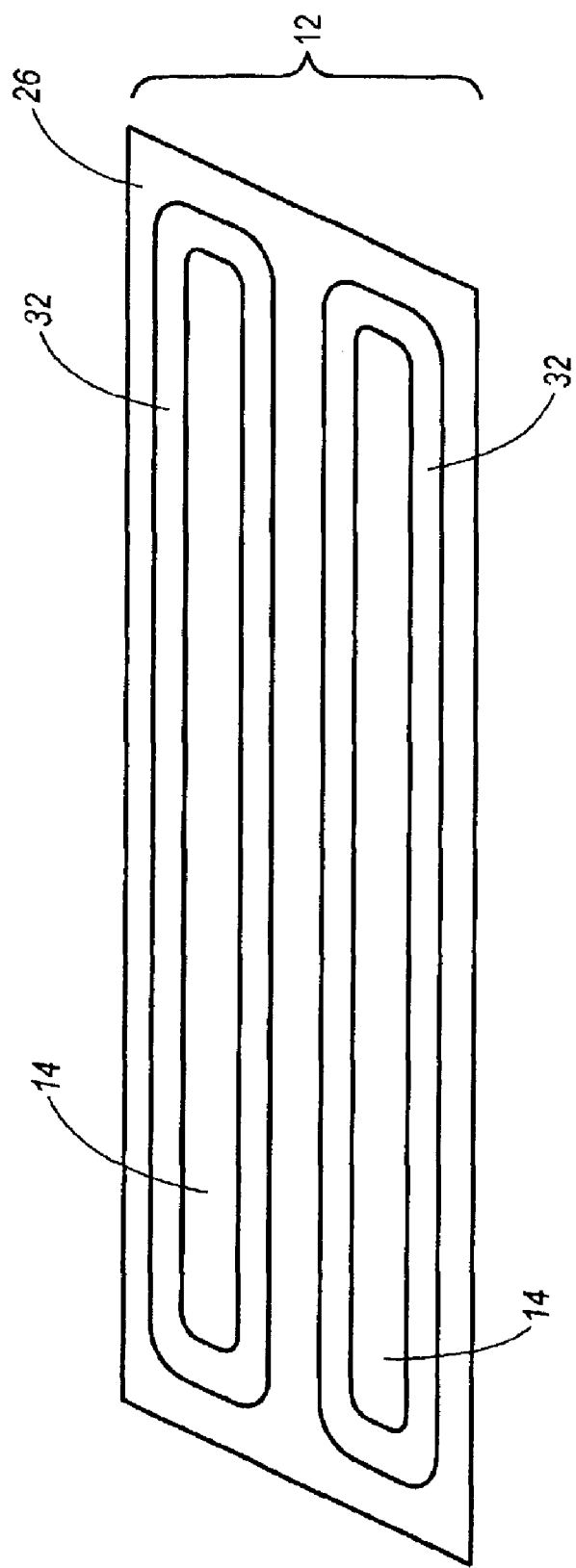
FIG. 8 shows a top view of an alternate embodiment of a piezoelectric transducer having multiple piezoelectric material elements according to the present invention.

FIG. 8 shows a sub-chamber diaphragm support structure 26 for a chamber diaphragm 10 shaped like a trapezoid and containing two piezoelectric material elements 14 having an elongated shape and placed side-by-side to each other, but offset slightly to compensate for the trapezoid shape of the sub-chamber diaphragm support structure 26.

Figure 9:
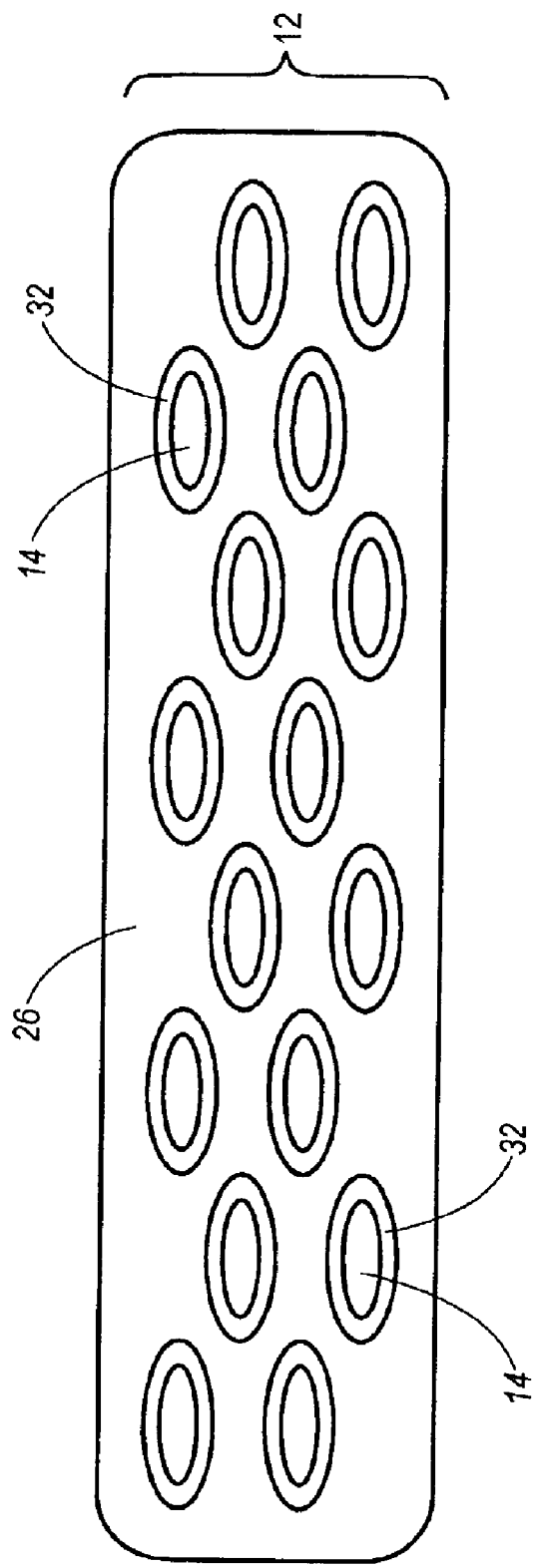
FIG. 9 shows a top view of an alternate embodiment of a piezoelectric transducer having multiple piezoelectric material elements according to the present invention.

FIG. 9 shows a sub-chamber diaphragm support structure 26 for a chamber diaphragm 10 with a substantially long rectangular shape having filleted or rounded corners and containing 16 small, oval shaped piezoelectric material elements 14 arranged in an offset arrayed pattern.

Figure 10:
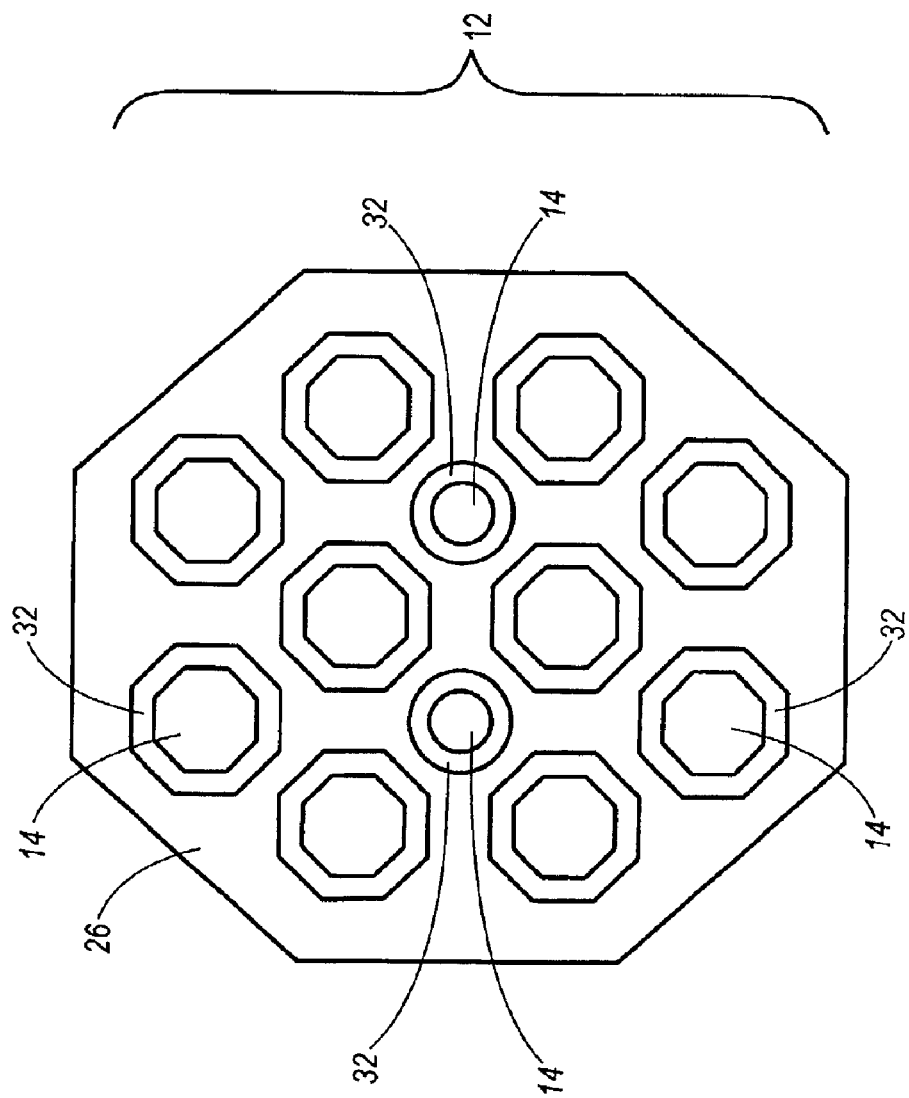
FIG. 10 shows a top view of an alternate embodiment of a piezoelectric transducer having multiple piezoelectric material elements according to the present invention.

FIG. 10 shows a sub-chamber diaphragm support structure 26 for a chamber diaphragm 10 shaped in an octagon having 10 piezoelectric material elements 14 that are octagonal and 2 piezoelectric material elements 14 that are round. The 14 octagonal piezoelectric material elements 14 are arranged in an irregular array pattern with the two round piezoelectric material elements 14 contained interstitially between the octagonal piezoelectric material elements 14. This is to achieve better coverage of the chamber diaphragm 10 than may be easily possible using piezoelectric material elements 14 of only one size and shape.

Figure 11:
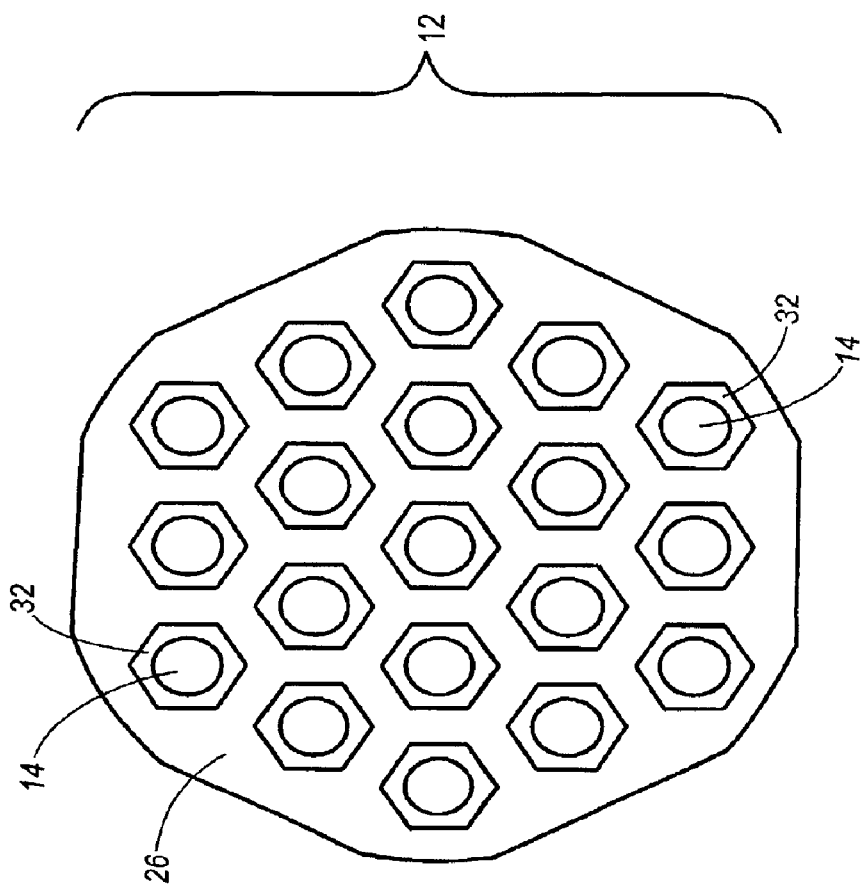
FIG. 11 shows a top view of an alternate embodiment of a piezoelectric transducer having multiple piezoelectric material elements according to the present invention.

FIG. 11 shows a sub-chamber diaphragm support structure 26 for a chamber diaphragm 10 of an irregular ovoid shape having 19 oval piezoelectric material elements 14 contained within hexagonal sub-chamber diaphragm support structure gaps.

As can be seen in FIGS. 7–10, many variations are possible. The shape of the sub-chamber diaphragm support structure 26 and the chamber diaphragm can be polygonal including the rectangle shown in FIG. 1, the trapezoid shown in FIG. 8, the octagon shown in FIG. 10 or any number of curved shapes such as shown in FIG. 11 and including shapes such as ellipses, ovals, circles, or other curved shapes. The sub-chamber diaphragm support structure 26 or the chamber diaphragm 10 may be a polygonal shape with rounded corners, such as the substantially rectangular shape shown in FIG. 9. It should be noted that many manufacturing methods, such as etching, that can be used to form the chamber diaphragm may take substantially polygonal shapes and create them with rounded corners and in particular, polygons with 6 or more sides may in some instances appear to be irregular ovals, such as shown in FIG. 11, ellipses, circles, or other curvilinear shapes after manufacture.

The number of piezoelectric material elements 14 used can be as few as two, as shown in FIG. 8, or contain as many as desired to achieve the desired stiffness characteristics such as the nineteen shown in FIG. 11. The arrangement of the piezoelectric material elements 14 can be in any array, both regular, as shown in FIGS. 1, 7, 8 and 10 and irregular as shown in FIG. 10. The shape of the piezoelectric material element may be any desired shape including circles, polygons, ovals, ellipses, or other shapes. It should be noted that some manufacturing methods, such as etching, that can be used in the formation of the piezoelectric material elements 14 may take substantially polygonal shapes and create them with rounded corners and in particular, polygons with 6 or more sides may in some instances appear to be irregular ovals, ellipses, circles, or other curvilinear shapes after manufacture. The piezoelectric material elements 14 may vary in size and shape on a single chamber diaphragm 10 as shown in FIG. 10.

The shape of the sub-chamber diaphragm support structure gap 32 may also vary. It can be any of the shapes possible for the piezoelectric material element 14 although it need not be exactly the same shape as shown in FIG. 11 so long as the piezoelectric material element 14 will fit within the sub-chamber diaphragm support structure gap 32. Again, it should be noted that some manufacturing methods, such as etching, that can be used in the formation of the sub-chamber diaphragm support structure gap 32 may take substantially polygonal shapes and create them with rounded corners and in particular, polygons with 6 or more sides may in some instances appear to be irregular ovals, ellipses, circles, or other curvilinear shapes after manufacture.

The structures described above can be made in a variety of ways using well known processing techniques. Therefore, the description that follows will be an outline of just a few of manufacturing alternatives. It should be noted that not all of the processing techniques discussed herein may be applicable to every embodiment, and some embodiments may be preferably constructed with some methods and not others.

The chamber diaphragm 10 and the surrounding structure to create the chamber 16 may be constructed first, with many methods possible. One method might be to laminate a stack of stainless steel parts, which have been chemically etched to define appropriate patterns. The stack can be laminated using well-known brazing processes. If this is done, it may be advantageous to construct the sub-chamber support structure concurrently as part of the stack. Alternatively, if may be advantageous to pre-process some or all of the structures on the chamber diaphragm before constructing the stack.

Alternatively, chamber diaphragm 10 and the structure surrounding the chamber 16 could be made using Silicon single crystal material, both doped and undoped, sapphire, crystals, or other materials that can be etched. One simple process for etching out the chamber 16 is to provide a top surface, which will become the chamber diaphragm 10 which acts as an etch stop. For instance, heavily doped silicon, oxides, or nitrides may be used. The chemical etchant can then be used to etch the chamber 16 from the bulk material with the assurance that the etch stop material will remain behind to form the chamber diaphragm 10. Further, the chamber diaphragm 10 and the structure surrounding the chamber 16 may be stamped or formed using any number of plastic materials or plastic composites or epoxy resins.

The criterion in selecting a material for the chamber diaphragm 10 and the structure surrounding the chamber 16 are materials suitable for the environment the final structure is to be used in, ease of manufacturability, suitability for subsequent process steps, and appropriate stiffness, commonly described by mechanical elastic modulus and poisson ratio characteristics. In particular, the stiffness of the chamber diaphragm 10 should be similar to the stiffness characteristics of the piezoelectric material element to be utilized. A stiffness ratio of 1/100th to 100 relative to the piezoelectric material element can be used, although it should be noted that there may be some performance degradation as the values diverge.

The insulative layer can then be deposited on the chamber diaphragm upper surface 30 using any of the well known thin film deposition techniques such as CVD deposition, sputtering, or spin coating & curing. The conductive layer can then be deposited using any one of a variety of conventional techniques, such as sputtering, evaporation, or plating. If bimorph structures are being constructed it may be necessary to deposit an insulative layer on both the chamber diaphragm upper surface 30 and the chamber diaphragm lower surface 28 as well as depositing a conductive layer on both surfaces.

Next the piezoelectric material elements are formed and/or attached. If the piezoelectric material elements are formed in a separate process, as might be the case if the piezoelectric material elements are purchased from a variety of vendors that make such parts, then standard epoxies or other adhesives could be used to adhere the elements to the surface. However, prior to attachment it would be necessary to apply a conductive material to two sides of each piezoelectric material element, if not already done by the vendor. These conductive layers could be formed using any of the well known processes of vacuum deposition, plating, screen printing to the surface and firing, or the application of conductive epoxies.

Alternatively, piezoelectric material elements may be formed in place. The piezoelectric material elements may formed in place using any one of a variety of known thin film methods such as sol-gel deposition, sputtering, hydrothermal growth, or screen printing and firing. Once a layer of piezoelectric material has been formed then it could be patterned using well-known photolithography processes utilizing chemical etching or sputtering to remove the piezoelectric material from areas where it is not desired leaving the piezoelectric material elements remaining.

The sub-chamber diaphragm support structure can be made of a variety of materials such as stainless steel, nickel, aluminum, silicon, polysilicon, silicon dioxide, silicon nitride, plastics and glass The sub-chamber diaphragm support structure should be at least twice as stiff as the chamber diaphragm 10. The sub-chamber diaphragm support structure is then aligned to the piezoelectric material elements and attached using any of a variety of well known techniques and materials such as adhesives, for example epoxy, low temperature soldering, or other techniques. It should be noted that the sub-chamber diaphragm support structure may be attached and/or formed earlier. For instance, the sub-chamber diaphragm support structure may be attached and formed as part of the initial process to form the chamber diaphragm 10 and structure surrounding the chamber 16 if the sub-diaphragm support structure is to be attached to the chamber diaphragm lower surface 28 as shown in FIG. 3. Alternatively, the sub-chamber diaphragm support structure may be attached prior to the formation and/or attachment of the piezoelectric material elements.

Finally electrical contacts are made. Again, these can be made using a variety of well-known techniques such as wire bonding, fuzz buttons, or spring contacts.

If the piezoelectric material elements 14 were not poled prior to attachment, then after the construction is complete, the electrical contacts 24 can be used to pole the piezoelectric material elements 14. It should be noted that if poling of the piezoelectric actuators is done after completion of the structure, it may be necessary to immerse the structure in a non-conducting fluid, such as certain oils or fluorinated hydrocarbons, to prevent arcing during the poling.

What is claimed is:

1. A piezoelectric transducer comprising:
   a) a chamber diaphragm having an upper surface, a lower surface, and at least two sub-chamber diaphragms wherein each sub-chamber diaphragm has a sub-chamber diaphragm perimeter.
   b) at least one sub-chamber diaphragm support structure having at least two gaps therethrough, adjacent to one of the upper surface or lower surface of the chamber diaphragm, wherein each gap has a gap perimeter, the gap perimeter of each gap being substantially coincident with one of the sub-chamber diaphragm perimeters.
   c) at least two piezoelectric material elements adjacent to one of the upper surface or lower surface of the chamber diaphragm so constructed and arranged as to be aligned with the at least two gaps of the sub-chamber diaphragm support structure.

2. The piezoelectric transducer of claim 1 wherein the at least two piezoelectric material elements are adjacent to the same surface of the chamber diaphragm as the sub-chamber diaphragm support structure.

3. The piezoelectric transducer of claim 1 wherein the at least two piezoelectric material elements are adjacent to the other surface of the chamber diaphragm from the sub-chamber diaphragm support structure.

4. The piezoelectric transducer of claim 1 wherein the chamber diaphragm further comprises an insulative layer interposed between the chamber diaphragm and the piezoelectric material elements.

5. The piezoelectric transducer of claim 1 further comprising an electrical contact layer interposed between the piezoelectric material elements and the chamber diaphragm.

6. The piezoelectric transducer of claim 1 wherein the at least two piezoelectric material elements are arranged in an array.

7. The piezoelectric transducer of claim 1 wherein the at least one sub-chamber diaphragm is circularly shaped.

8. The piezoelectric transducer of claim 1 wherein the at least one sub-chamber diaphragm is polygonally shaped.

9. The piezoelectric transducer of claim 8 wherein the at least one sub-chamber diaphragm is hexagonally shaped.

10. The piezoelectric transducer of claim 1 wherein there are at least three piezoelectric material elements, at least one of the piezoelectric material elements is adjacent to the same surface of the chamber diaphragm as the sub-chamber diaphragm support structure, and at least one of the piezoelectric material elements is adjacent to the other surface of the chamber diaphragm from the sub-chamber diaphragm support structure.

11. The piezoelectric transducer of claim 1 wherein there are two sub-chamber diaphragm support structures, one sub-chamber diaphragm support structure is adjacent to the upper surface, and the other sub-chamber diaphragm support structure is adjacent to the lower surface.

12. The piezoelectric transducer of claim 11 wherein there are at least three piezoelectric material elements, at least one of the piezoelectric material elements is adjacent to the upper surface, and at least one of the piezoelectric material elements is adjacent to the lower surface.

13. A piezoelectric transducer comprising:
   a) a chamber diaphragm having an upper surface, a lower surface, and at least two spaced sub-chamber diaphragms therein, each sub-chamber diaphragm having a sub-chamber diaphragm perimeter.
   b) at least two piezoelectric material elements so constructed and arranged to actuate the at least two sub-chamber diaphragms.

14. The piezoelectric transducer of claim 13 further comprising a sub-chamber diaphragm support structure so constructed and arranged to provide additional stiffness to the chamber diaphragm in the areas between the at least two spaced sub-chamber diaphragms and substantially up to the sub-chamber diaphragm perimeters.

15. The piezoelectric transducer of claim 13 wherein the chamber diaphragm further comprises an insulative layer on the upper surface.

16. The piezoelectric transducer of claim 13 further comprising an electrical contact layer interposed between the piezoelectric material element and the upper surface of the chamber diaphragm.

17. The piezoelectric transducer of claim 13 wherein the at least two piezoelectric material elements are arranged in an array.

18. The piezoelectric transducer of claim 13 wherein the at least two sub-chamber diaphragms are circularly shaped.

19. The piezoelectric transducer of claim 13 wherein the at least two sub-chamber diaphragms are polygonally shaped.

20. The piezoelectric transducer of claim 13 wherein the at least two sub-chamber diaphragms are is hexagonally shaped.

21. The piezoelectric transducer of claim 13 wherein there are at least three piezoelectric material elements so constructed and arranged such that at least one sub-chamber diaphragms can be actuated by two of the piezoelectric material elements.

22. A piezoelectric transducer comprising:
   a) a chamber diaphragm having an upper surface, a lower surface, and at least two spaced sub-chamber diaphragms therein, each sub-chamber diaphragm having a sub-chamber diaphragm perimeter.
   b) at least two piezoelectric material elements so constructed and arranged to be actuated by the at least two sub-chamber diaphragms.

23. The piezoelectric transducer of claim 22 further comprising a sub-chamber diaphragm support structure so constructed and arranged to provide additional stiffness to the chamber diaphragm in the areas between the at least two spaced sub-chamber diaphragms and substantially up to the sub-chamber diaphragm perimeters.

24. The piezoelectric transducer of claim 22 wherein the chamber diaphragm further comprises an insulative layer on the upper surface.

25. The piezoelectric transducer of claim 22 further comprising an electrical contact layer interposed between the piezoelectric material element and the upper surface of the chamber diaphragm.

26. The piezoelectric transducer of claim 22 wherein the at least two piezoelectric material elements are arranged in an array.

27. The piezoelectric transducer of claim 22 wherein the at least two sub-chamber diaphragms are circularly shaped.

28. The piezoelectric transducer of claim 22 wherein the at least two sub-chamber diaphragms are is polygonally shaped.

29. The piezoelectric transducer of claim 22 wherein the at least two sub-chamber diaphragms are hexagonally shaped.

30. The piezoelectric transducer of claim 22 wherein there are at least three piezoelectric material elements so constructed and arranged such that at least one sub-chamber diaphragms can actuate two of the piezoelectric material elements.

31. A piezoelectric transducer comprising:
   a) a chamber diaphragm having two surfaces, and at least two sub-chamber diaphragms;
   b) at least one sub-chamber diaphragm support structure having at least two gaps therethrough each gap having a gap perimeter wherein the gap perimeter is substantially coincident a perimeter of a sub-chamber diaphragm, adjacent to one of the surfaces of the chamber diaphragm, and
   c) at least two piezoelectric material elements adjacent to one of the surfaces of the chamber diaphragm so constructed and arranged as to be aligned with the at least two gaps of the sub-chamber diaphragm support structure.

32. A piezoelectric transducer comprising:
   a) a chamber diaphragm have an upper surface, a lower surface, and a given area, b) at least one sub-chamber diaphragm support structure having at least two gaps therethrough wherein each gap defines a sub-chamber diaphragm area as a portion of the chamber diaphragm area, adjacent to one of the upper surface or lower surface of the chamber diaphragm, and c) at least two piezoelectric material elements wherein each piezoelectric element is adjacent to one of the upper surface or lower surface of the chamber diaphragm so constructed and arranged as to be aligned within a sub-chamber diaphragm area.

33. The piezoelectric transducer of claim 32 wherein the at least two piezoelectric elements are so constructed and arranged as to be actuated simultaneously.

34. The piezoelectric transducer of claim 32 wherein the at least two piezoelectric material elements are so constructed and arranged such that when one or more of the at least two piezoelectric material elements are actuated they cause a net motion of the chamber diaphragm equal to the sum of the individual motions of the sub-chamber diaphragms.

* * * * *